United States Patent
Watanabe et al.

(10) Patent No.: US 11,373,923 B2
(45) Date of Patent: Jun. 28, 2022

(54) HEAT SINK WITH COILED METAL-WIRE MATERIAL

(71) Applicant: MITSUBISHI MATERIALS CORPORATION, Tokyo (JP)

(72) Inventors: Kotaro Watanabe, Naka (JP); Toshihiko Saiwai, Naka (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 140 days.

(21) Appl. No.: 16/971,531

(22) PCT Filed: Jan. 9, 2019

(86) PCT No.: PCT/JP2019/000291
§ 371 (c)(1),
(2) Date: Aug. 20, 2020

(87) PCT Pub. No.: WO2019/163313
PCT Pub. Date: Aug. 29, 2019

(65) Prior Publication Data
US 2021/0090971 A1  Mar. 25, 2021

(30) Foreign Application Priority Data
Feb. 21, 2018 (JP) .............................. JP2018-028359

(51) Int. Cl.
*H01L 23/367* (2006.01)
*F28F 13/12* (2006.01)
*F28F 3/02* (2006.01)

(52) U.S. Cl.
CPC .......... *H01L 23/3672* (2013.01); *F28F 13/12* (2013.01); *H01L 23/3677* (2013.01); *F28F 3/02* (2013.01)

(58) Field of Classification Search
CPC ....... H01L 23/34; H01L 23/36; H01L 23/367; H01L 23/373; H01L 23/3672;
(Continued)

(56) References Cited

U.S. PATENT DOCUMENTS 3,262,190 A  *  7/1966  Rostoker ............... F28F 13/003
                                                       419/24
3,595,299 A  *  7/1971  Weishaupt ................ F17C 9/02
                                                       165/157
(Continued)

FOREIGN PATENT DOCUMENTS

BE        1023686 A1    6/2017
CN      205755233 U    11/2016
(Continued)

OTHER PUBLICATIONS

Supplementary European Search Report dated Nov. 3, 2021, issued for the European Patent Application No. 19757119.3.
(Continued)

*Primary Examiner* — Tho V Duong
*Assistant Examiner* — Raheena R Malik
(74) *Attorney, Agent, or Firm* — Locke Lord LLP (57) ABSTRACT

A heat sink including a metal-formed body having a base board part and two or more fin parts standing on a surface of the base board part and arranged in a parallel manner to each other, and one or more filled bodies consisting of a plurality of coiled metal-wire materials filled in one or more groove parts formed between the fin parts of the metal-formed body; the heat sink in which the coiled metal-wire materials have a first outer diameter at one end part and a second outer diameter at the other end part which is different from the first outer diameter; and the coiled metal-wire materials are metallurgically joined at partially to at least
(Continued)

one of an inner surface of the groove parts of the metal-formed body and the other coiled metal-wire materials.

16 Claims, 8 Drawing Sheets

(58) Field of Classification Search
CPC ..... H01L 23/3677; H01L 23/40; H01L 23/42; H01L 23/433; H01L 23/467; H05K 7/20; H05K 7/2039; H05K 7/20454; B21D 53/02; F28F 3/06; F28F 7/00; F28F 13/12; F28F 3/02; F28F 3/08; F28F 13/08; F28F 13/06; F28F 13/003; F28F 13/022; F28D 9/00; C22C 21/00; C22C 1/08; C22C 1/04; H01M 4/66; H01M 4/80; B22F 3/11
USPC ........................................................ 165/80.3
See application file for complete search history.

(56) References Cited

U.S. PATENT DOCUMENTS

| 5,497,824 | A * | 3/1996 | Rouf ...................... | F28F 13/12 |
| | | | | 165/184 |
| 6,591,897 | B1 * | 7/2003 | Bhatti ..................... | F28F 3/022 |
| | | | | 257/E23.105 |
| 6,761,211 | B2 * | 7/2004 | Bhatti ................. | H01L 23/3737 |
| | | | | 361/708 |
| 6,958,912 | B2 * | 10/2005 | Pokharna .............. | H01L 23/427 |
| | | | | 257/E23.098 |
| 2002/0108743 | A1 | 8/2002 | Wirtz | |
| 2003/0062151 | A1 * | 4/2003 | Sauciuc .............. | H01L 23/3672 |
| | | | | 257/E23.105 |
| 2009/0195990 | A1 * | 8/2009 | Honma .................. | F28F 3/022 |
| | | | | 361/710 |
| 2011/0012494 | A1 | 1/2011 | Yoo | |

FOREIGN PATENT DOCUMENTS

| EP | 2962791 A1 | 1/2016 |
| JP | H06-275746 A | 9/1994 |
| JP | H09-36284 A | 2/1997 |
| JP | 2003-119536 A | 4/2003 |
| JP | 2010-531536 A | 9/2010 |
| JP | 2012-9482 A | 1/2012 |
| JP | 2014-90209 A | 5/2014 |
| JP | 2018-141614 A | 9/2018 |
| WO | 05/067036 A1 | 7/2005 |
| WO | 2018/159601 A1 | 9/2018 |

OTHER PUBLICATIONS

International Search Report dated Mar. 19, 2019, issued for PCT/JP2019/000291.

* cited by examiner

HEAT SINK WITH COILED METAL-WIRE MATERIAL

BACKGROUND OF THE INVENTION

Technical Field

The present invention relates to a heat sink used for radiating heat.

Priority is claimed on Japanese Patent Application No. 2018-028359, filed Feb. 21, 2018, the content of which is incorporated herein by reference.

Background Art

In electric components generating heat, such as power modules and the like on which semiconductor elements such as power elements are mounted, a heat sink is provided for radiating the heat of the semiconductor elements generating heat, in order to run the electric components normally. The heat sink is formed from aluminum and copper having high thermal conductivity and often uses a structure in which fins of a number of plates or pins stand on one surface of a flat-board-like base board part. The heat sink cools an object being cooled by bring the base board part into contact with the object being cooled of the power module or the like and disposing the fin in a passage of heat medium.

For example, Patent Document 1 describes a heat sink on which solid fins stand on a base board. Patent Document 2 describes a heat sink in which a porous material is filled between fins made from solid material, improving heat transfer coefficient by enlarging specific surface area of fins. Patent Document 3 describes a heat sink in which specific surface area is higher than the fins formed of solid material by arranging coils on a base board, so as to have higher heat transfer coefficient.

CITATION LIST

Patent Documents

Patent Document 1: Japanese Unexamined Patent Application, First Publication No. 2003-119536
Patent Document 2: Japanese Unexamined Patent Application, First Publication No. 2012-009482
Patent Document 3: Japanese Unexamined Patent Application, First Publication No. H06-275746

SUMMARY OF INVENTION

Technical Problem

However, heat transfer coefficient of the heat sink described in Patent Document 1 cannot be expected to be high because the fins are solid and the surface area is small. The heat sink described in Patent Document 2 has the large specific surface area of the porous body so that the heat transfer coefficient is high; but a pressure loss is too high because a space is small for the heat medium to flow. In the structure described in Patent Document 3, the heat is not easily transmitted to the whole coils, since the coils are wire material so that section area is small and thermal resistance is high.

In contrast, the Inventor proposes straight fins of a structure in which fiber porous body is joined on a surface of a core part of solid material in Japanese Patent Application No. 2017-149843. This heat sink is expected to be lower in the pressure loss than foamed metal because the fiber of the fiber porous body filling grooves of the straight fins reduces the pressure loss by the orientation. However, it is required for heat sinks to have further low pressure loss.

The present invention has an object to improve the heat transfer coefficient of the heat sink furthermore and to reduce the pressure loss furthermore.

Solution to Problem

A heat sink of the present invention includes a metal-formed body having a base board part and two or more fin parts standing on a surface of the base board part and arranged in a parallel manner to each other, and one or more filled bodies consisting of a plurality of coiled metal-wire materials filled in one or more groove parts formed between the fin parts of the metal-formed body. The coiled metal-wire materials have a first outer diameter at one end part and a second outer diameter at the other end part which is different from the first outer diameter. The coiled metal-wire materials are joined by metallurgical at partially to at least one of an inner surface of the groove parts of the metal-formed body and the other coiled metal-wire materials.

In this heat sink, the groove part between the fin parts made of solid material is filled by a filler made of the plurality of coiled metal-wire materials, and heat transmission is performed in a broad area including the fin parts, the base board part, and the filler. The filler is joined on the inner surface of the groove part of the metal-formed body with metallurgical bonding parts therebetween; and the coiled metal-wire materials are also bonded metallurgically on the metal-formed body or the other coiled metal-wire materials, so that thermal resistance at a bonding boundary surface is small and the heat is smoothly transmitted between the metal-formed body and the filler.

Heat medium flows through space in the filler, and the heat is exchanged between surfaces of the coiled metal-wire materials and the metal-formed body (the fin parts and the base board part) and the heat medium. The coiled metal-wire materials in the filler are different in the outer diameter of the coils between one end part and the other end part, and arranged so that the parts of the coiled metal-wire materials cross the flow of the heat medium along a longitudinal direction of the groove part. As a result, the coiled metal-wires can reliably receive the heat from the heat medium, and obstruct the flow of the heat medium so as to disturb the flow (an disturbing effect), so that the thermal exchange can be advanced.

Since the filler formed from the coiled metal-wire material, opening size of spaces are large, so that the pressure loss is smaller than in foamed metal and fiber porous body. Moreover, the filler can be freely controlled in a filling ratio in the groove part and the like only by changing thickness and a winding number of the coiled metal-wire material: flexibility of designing products is high. The coiled metal-wire materials have a shape of winding wire material in a coil shape which can be easily formed. For the coiled metal-wire materials, wound wire material formed by tandem rolls and the like and also cut pieces of cutting solid material can be used.

The fin parts, the base board part, and the filler are joined by sintering, solid phase bonding, and soldering, or brazing. That is to say, it is different from machinery bonding but metallurgical bonding having a chemical bond between metal atoms at a boundary surface.

As a preferred embodiment of the heat sink of the present invention, it is preferable that the coiled metal-wire materials be made to have a cross sectional shape of a polygon with not more than five corners in a direction perpendicular to a length direction.

The cross sectional shape of the coiled metal-wire material may be a circle and an oval. In a case in which it is the circle or the oval, if the coiled metal-wire materials are arranged in a direction crossing the flow of the heat medium, the flow is smoothly separated along both the side surfaces (arc surfaces) of the coiled metal-wire materials, and moved toward a downstream side. In contrast, if the cross sectional shape of the coiled metal-wire materials is any of a triangle, a tetragon, and a pentagon, an outer form is formed by a plurality of flat surfaces or a curved surface with a large curvature radius. When the flow of the heat medium crosses the flat surface or the curved surface, the flow meets the crossed surface and swirls in a rear of the coiled metal-wire material. As a result, the flow is further disturbed and the disturbing effect is increased, and the heat exchange can be further advanced. In addition, the cross sectional shape being the tetragon includes also a wire material of a thin-seat shape.

As a preferred embodiment of the heat sink of the present invention, it is preferable that N/L of the coiled metal-wire materials be not less than 0.1 mm$^{-1}$ where a whole length of single coil is L mm and a winding number is N.

If N/L is less than 0.1 mm-1, there are few chances for the flow to be disturbed and it is difficult to obtain an expected effect in the disturbing effect.

As a preferred embodiment of the heat sink of the present invention, it is preferable that (DA−DB)/L be not less than 0.05 where a maximum outer diameter is DA mm, a minimum outer diameter is DB mm, and a whole length of single coil is L mm in the coiled metal-wire materials.

As a preferred embodiment of the heat sink of the present invention, cut pieces generated by cutting work may be used.

The cut pieces can be used as they are without specific work and easily obtained.

A heat sink of the present invention is preferable that a space ratio of a space volume to a whole volume V=S1×S2×h1 be not less than 50% and not more than 65% where S1×S2 is a flat area of the metal-formed body and "h1" is a height of the fin parts. Also in a case in which soldering material or brazing material is used for metallurgical bonding of the coiled metal-wire materials, it is possible to maintain a suitable flow rate of the heat medium if the space ratio is in the range and the heat can be efficiently transferred.

Advantageous Effects of Invention

According to the present invention, since using the coiled metal-wire materials can advance an enlarging effect of the surface area of the fins and the disturbing effect disturbing the flow of the heat medium, heat transfer coefficient of the heat sink can be improved; and the pressure loss can be reduced since the space is large.

DESCRIPTION OF EMBODIMENTS

Embodiments of the present invention will be explained below. A heat sink 101 showing one embodiment of the present invention has a compound structure combining a metal-formed body 10 and fillers 20 consisting of a plurality of coiled metal-wire materials 21 as shown in observation images in FIG. 1 and FIG. 2 and FIG. 3 to FIG. 5.

The metal-formed body 10 is provided with a base board part 11 with a flat-board shape, and fin parts 12 with a plurality of belt-board shape (a plate shape) standing on one surface of the 11 and arranged mutually in parallel. The fillers 20 are filled in groove parts 13 formed between the fin parts 12.

The metal-formed body 10 is an aluminum-formed body in which the 11 and the fin parts 12 are integrally formed by solid material of aluminum (including aluminum alloy). Each of the fillers 20 is formed from the plurality of the 21 made of the same aluminum as the 11 and the fin parts 12 (the 10) and composed from the 21 filled in one groove part 13.

The 10 and the 20 are not limited to be made of aluminum or aluminum alloy if the thermal conductivity is good. Because bonded by sintering as described later, the 10 and the 20 may be made of different metals if the metals can be sintered. Also in a case in which the 10 and 20 are bonded by soldering or brazing instead, the metals are sufficient if the thermal conductivity is good and they can be bonded by soldering or brazing.

Figure 1:
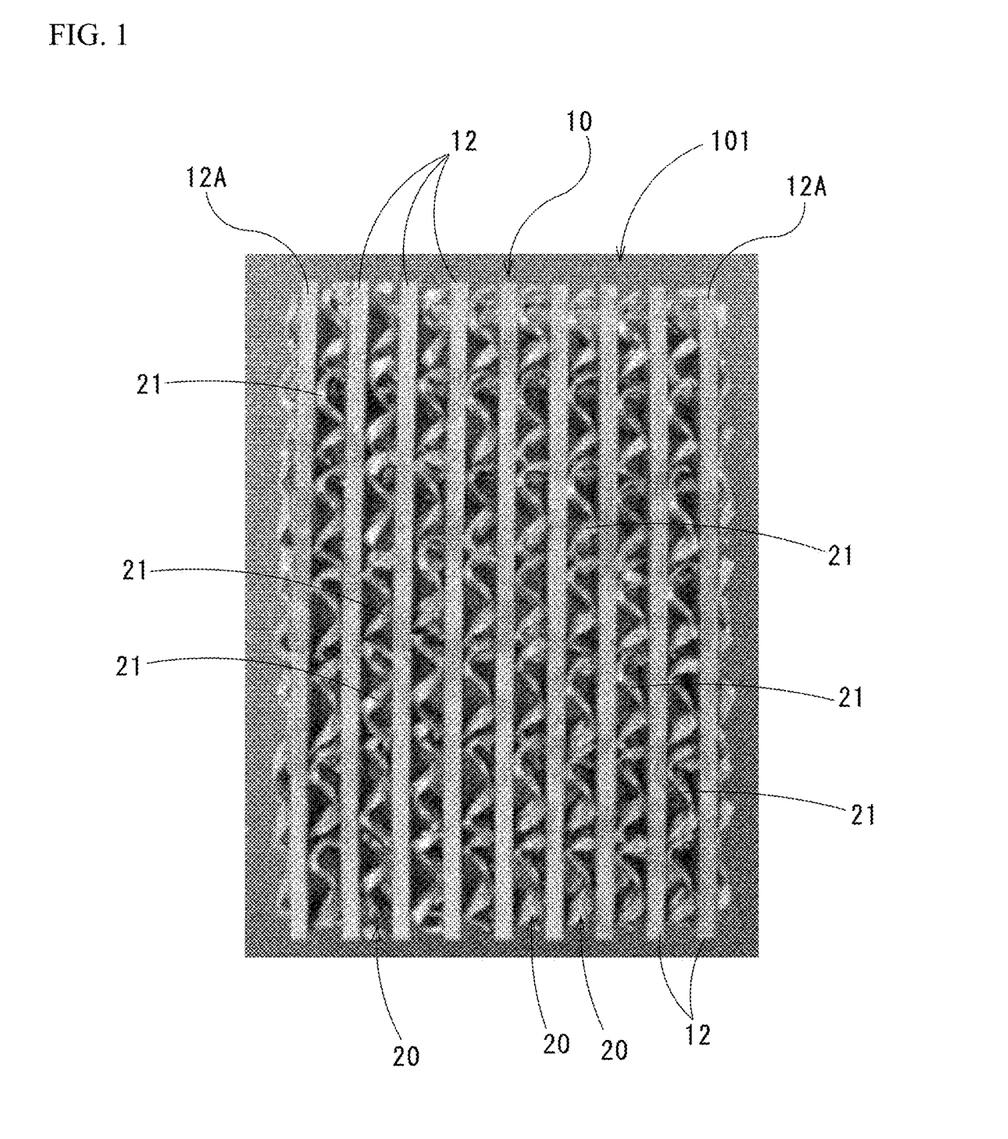
FIG. 1 It is an observed image of an external view corresponding to a plan view of a heat sink of an embodiment of the present invention.
Figure 2:
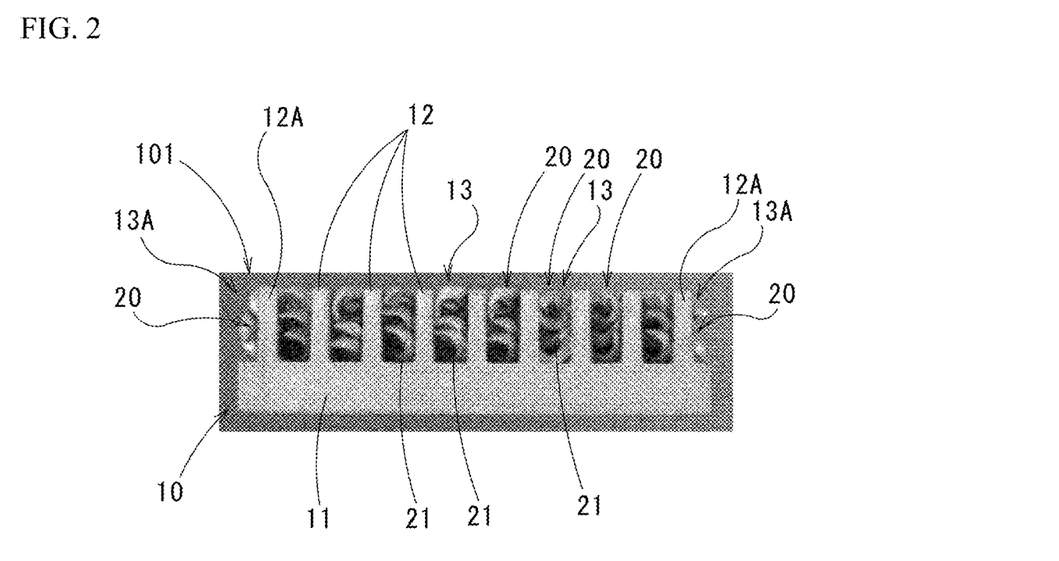
FIG. 2 It is an observed image of an external view corresponding to a side view of the heat sink of FIG. 1.
Figure 3:
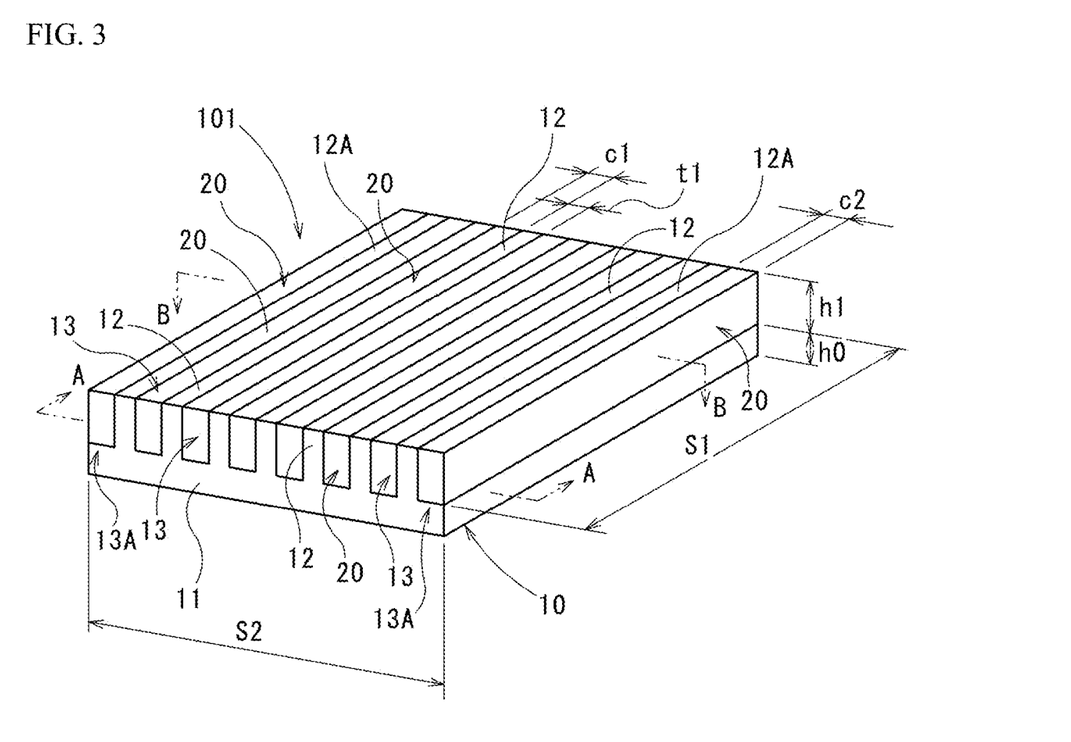
FIG. 3 It is a perspective view schematically showing the heat sink of the embodiment in FIG. 1.
Figure 4:
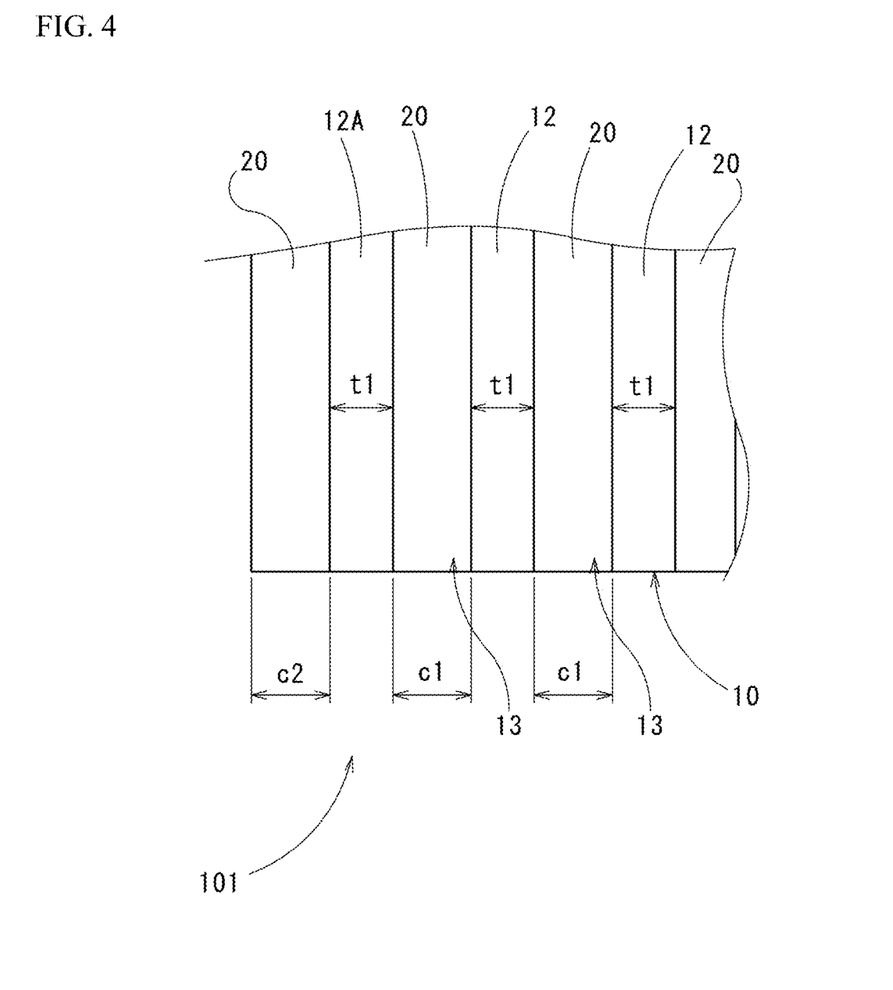
FIG. 4 It is a plan view enlarging a part of FIG. 3.
Figure 5:
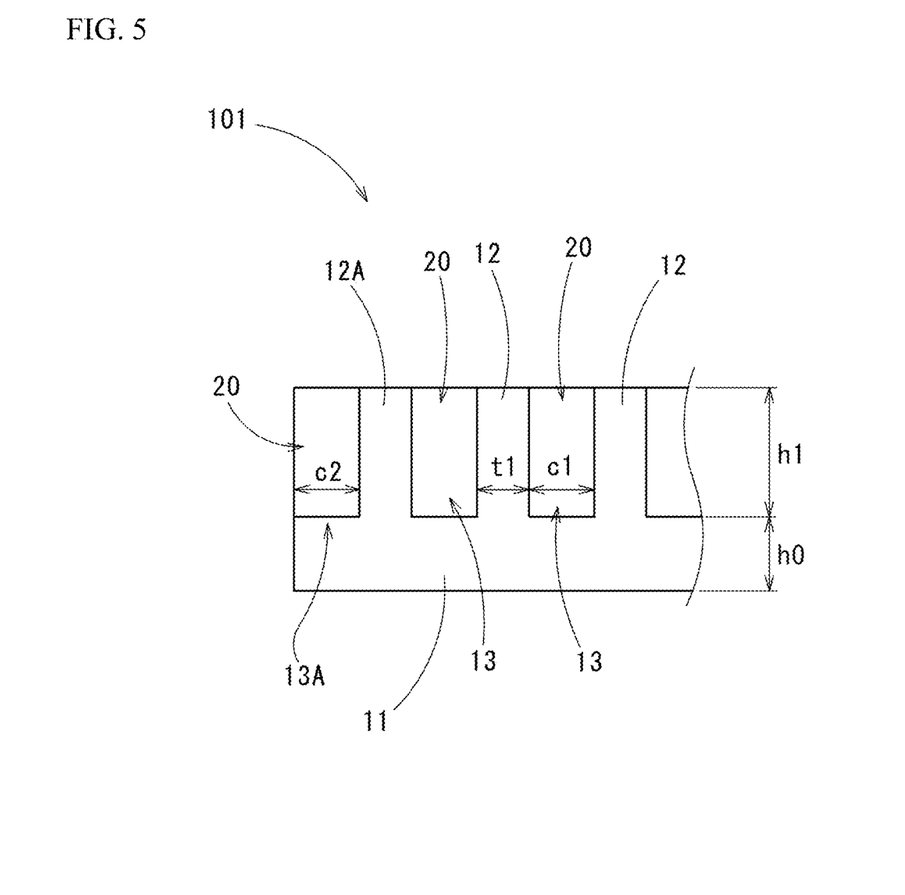
FIG. 5 It is a side view enlarging a part of FIG. 3.

As shown in FIG. 3 to FIG. 5, the 11 has a rectangular flat surface shape; on a surface of the 11, the 12 are provided to stand with a prescribed height h1 and a prescribed thickness t1. In an example shown in FIG. 3, the fin parts 12 are provided in a surface direction parallel to a surface of the 11 over a whole length of a longitudinal direction (a depth direction or a length direction), and arranged mutually parallel with a prescribed spacing interval c1 in a transverse direction (a width direction) of the 11. Between the fin parts 12, the groove parts 13 having an opening width of the spacing interval c1 are formed.

In these fin parts 12 in the heat sink 101, outer fin parts 12A are arranged on outermost of both side portions of the heat sink 101; and an outer side surface of the outer fin parts 12A is arranged inside both edge surfaces of the 11. However, the outer side surface of the outer fin parts 12A and the edge surfaces of the 11 may be the same surface. In this case, the fillers 20 are not disposed at the outer side of the outer fin parts 12A. That is to say, the outer fin parts 12A is not necessarily disposed inner than the edge surfaces of the 11.

A distance c2 between the outer side surface of the outer fin parts 12A and the edge surface of the 11 is the same as the spacing interval c1 or smaller than the spacing interval c1.

Figure 7A:
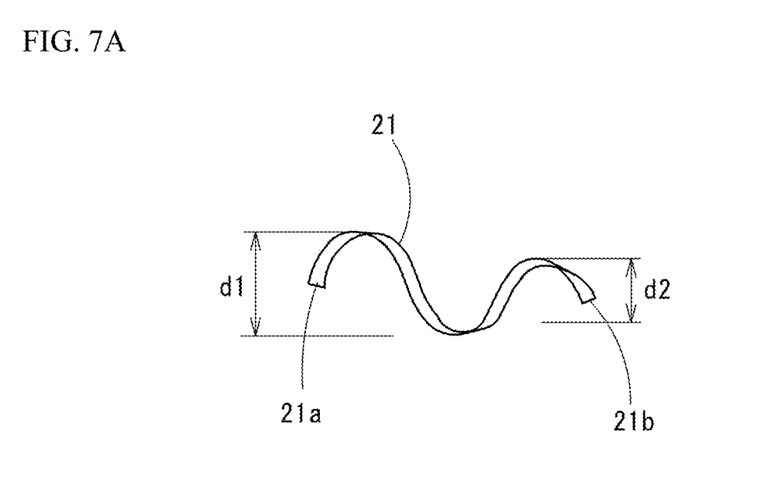
FIG. 7A It is a schematic view of a coiled metal-wire material composing the filler.
Figure 7B:
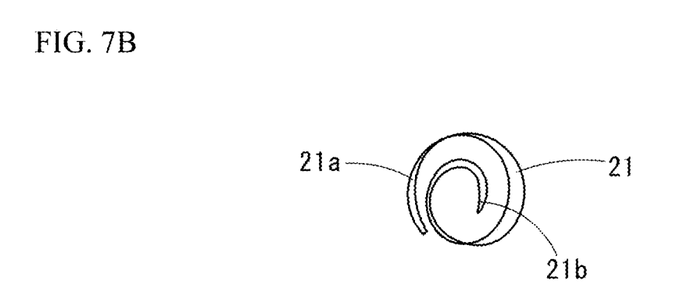
FIG. 7B It is a schematic view of the coiled metal-wire material composing the filler.

As schematically shown in FIG. 7, the 21 composing the 20 are formed to be wound as a coiled shape as a whole but not a proper coil, but formed to be twisted as a whole. A first outer diameter d1 at one end (a larger-diameter-end portion 21a) side is larger than a second outer diameter d2 at the other end (a smaller-diameter-end portion 21b).

Here, the larger-diameter-end portion 21a is an end portion at the side in which the outer diameter is larger; and the smaller-diameter-end portion 21b is an end portion at a side in which the outer diameter is smaller. Since the 21 are deformed by twisting substantially in a spiral shape, it is difficult to measure the outer diameter of the 21 as an outer diameter of a circle. Accordingly, the outer diameter is a dimension which can be obtained by measuring two points positioned outermost at about one wound or more the wire material from a distal end and being opposite with 180° in a perpendicular direction to a length direction of the coil.

In each of the 21 in the 20, where L mm is single coil length (an entire length of one coiled metal-wire material) and N is a winding number, N/L is not less than 0.1 mm$^{-1}$; and where DA mm is a maximum outer diameter and DB mm is a minimum outer diameter, (DA−DB)/L is not less than 0.05. The maximum outer diameter DA of the 21 is not the d1 which is a measurement of the single coiled metal-wire material 21, but an average value of a longest major axis and a perpendicular minor axis in a state of being deformed to be pressed in a radial direction by being filled between the fin parts 12.

Figure 9:
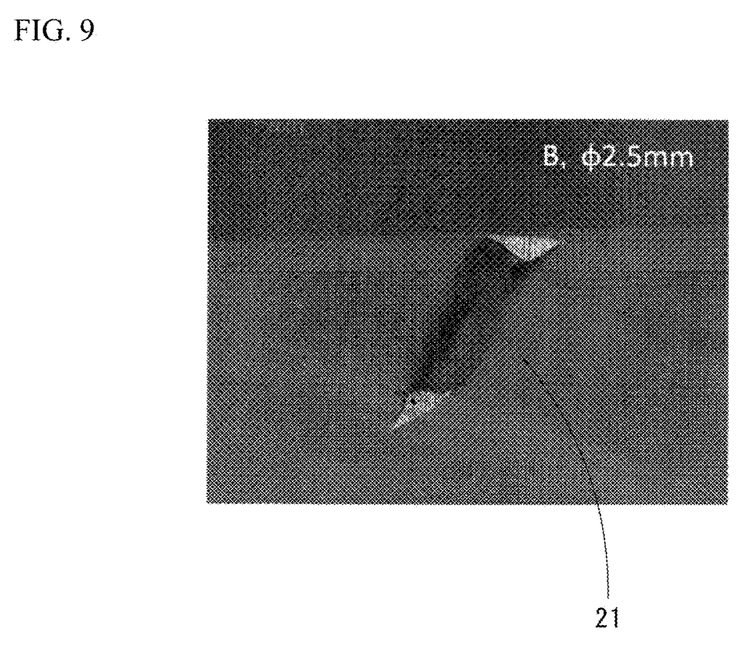
FIG. 9 It is a sectional photograph of the cut piece.

A cross sectional shape orthogonal to the length direction of the 21 is not a circle but a triangle as shown in FIG. 9.

Figure 6:
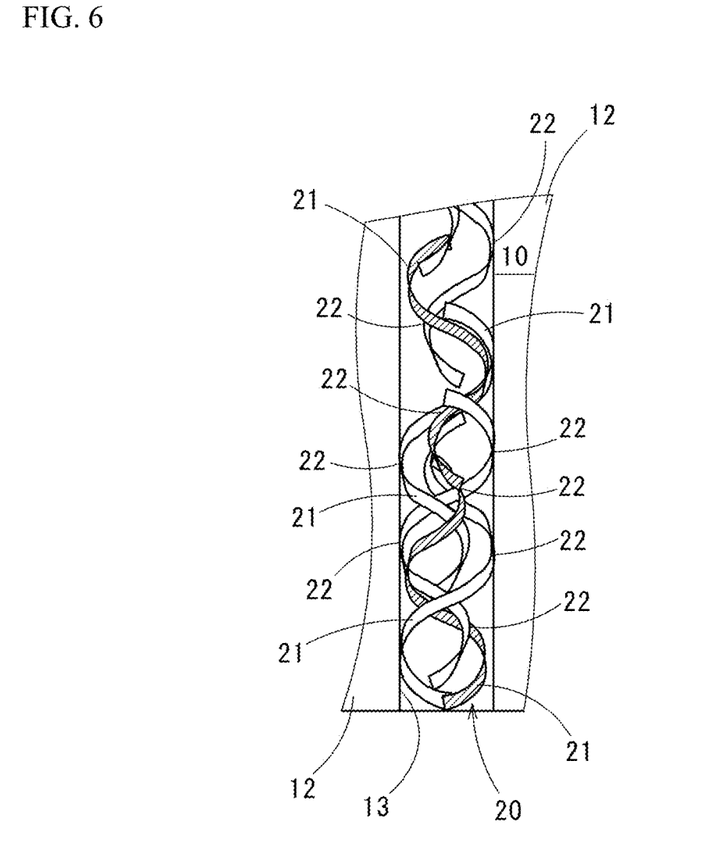
FIG. 6 It is a plan view schematically showing a filler filled in a groove part of a metal-formed body.

The fillers 20 are provided along the length direction of the 12 to fill the spacing interval c1 of the 12, and joined on an inner surface of the groove parts 13 (a surface of the 11 or the 12) with a sintered part (a metallurgical bonding part) 22 therebetween. As shown in FIG. 6, all of the 21 in the 20 are not always bonded on the 12 or the 11. There is a case in which only the 21 to each other are bonded with the sintered part 22 therebetween. However, as for one filler 20 inside the groove part, some parts in the whole length are joined on the 12 or the 11 with the sintered part 22 therebetween.

In other words, as for the 21, some are joined on both the inner surface of the groove part of the 10 and the other 21 with the sintered parts 22 therebetween; some are not joined on the inner surface of the groove part 13 of the 10 but joined on the other 21 with the sintered parts 22 therebetween; and contrarily, some are not joined on the other 21 but joined on the inner surface of the groove part of the 10 with the sintered parts 22 therebetween. The 21 illustrated by hatching in FIG. 6 are not joined to the 10 but joined to the other 21 only.

As described above, each of the 21 has the different diameters at the 21a and the 21b. Since each of the 21 is arranged so that the length direction of the coil is along the length direction of the groove part 13 between the 12 in the 10, a circumferential direction (a side surface of the wire material) of the 21 toward the 21b from the 21a crosses the length direction of the groove part 13, so that each of the 21 is arranged to cross and receive the flow of the heat medium flowing in the groove part 13. The cross section of the 21 is a triangle formed by combining flat surfaces or curved surfaces, so that the flat surfaces and the curved surfaces cross to the flow of the heat medium.

Figure 8:
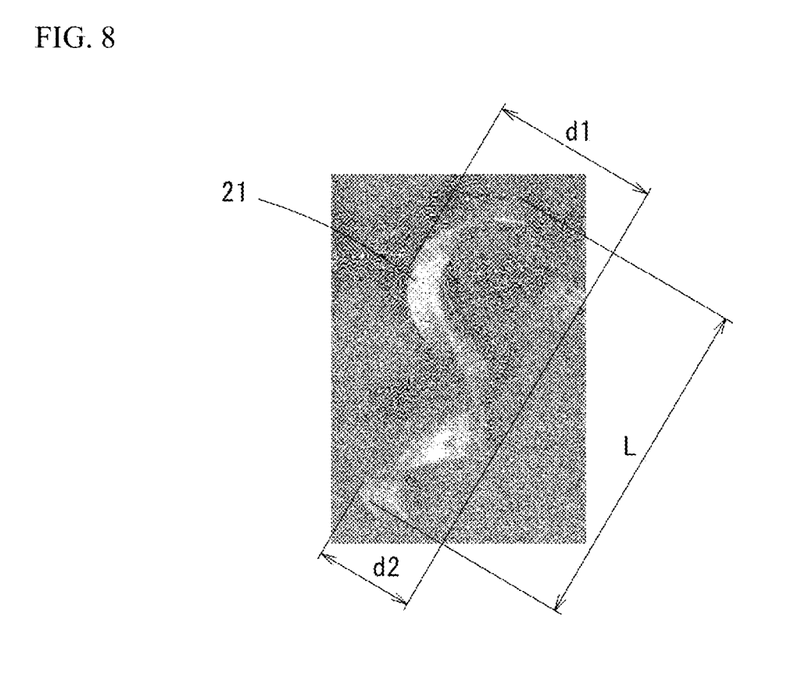
FIG. 8 It is a photograph of a cut piece used for the coiled metal-wire material.

For the 21 composing the 20, a shape obtained by precision machining and furthermore cut pieces (refer to FIG. 8 and FIG. 9) generated by cutting process by a milling machine and the like can be suitably used. Cross section of the cut pieces can be specified by a shape of a cutting edge of cutting tools, especially a shape of a rake face of the cutting edge, cutting property of cut works, cutting conditions and the like; but the shape is not constant and indefinite. As the cut pieces shown in FIGS. 8 and 9, the cross section of the 21 has corners; and surfaces between the corner parts are composed by the before-mentioned flat surfaces, the curved surfaces, curved surface with small unevenness and the like.

In the present invention, the cross section of the coiled metal-wire materials is not limited to the triangle, but a tetragon, a pentagon can also be used.

In the heat sink 101, the size of the space through which the heat medium can flow (a space ratio) influences on pressure loss and heat transfer amount of the heat medium. The space ratio is obtained as a ratio of a volume of the space (a volume except portions of metal (aluminum) in the 12 and the 20) to a whole volume V, where the whole volume V is a product of multiplying a flat area (a flat area of the 10: S1×S2 in FIG. 3) of an area on which the heat medium flows in a surface of the 11 and a height h1 of the 12. The space ratio in the heat sink 101 is preferably not less than 50% and not more than 65%.

As an example shown in FIG. 3, the whole surface of the 10 on which the 12 stand is exposed to the air or the like, so that the heat is exchanged between the whole surface and the heat medium (e.g., the air, water). The whole volume V for calculating the space ratio is a product of the flat area (S1×S2) of the 10 and the height h1 of the 12.

The heat sink 101 composed as above is manufactured by forming the solid metal-formed body 10 having the 11 and the 12 integrally by extrusion, forging, casting and the like, or by brazing to join the 11 and 12. To the 10, the 21 (the 20) are joined inside the groove part 13 between the 12 using a mold 51 shown in FIG. 10A.

Mixed powder of magnesium and silicon is used for joining the 21. Mg and Si are eutectic elements of Al: by attaching it on a surface of the wire material made of aluminum alloy and heating, it is possible to melt only the attached parts of the wire material and join them.

Suitable mixing ratio of magnesium and silicon in the mixed powder is magnesium one to silicon 1.5 by weight for example, so that it is possible to sufficiently maintain bonding strength of the 21. The mixed powder is adhered on the surface of the 21 using binder which is burned out by high temperature.

Figure 10A:
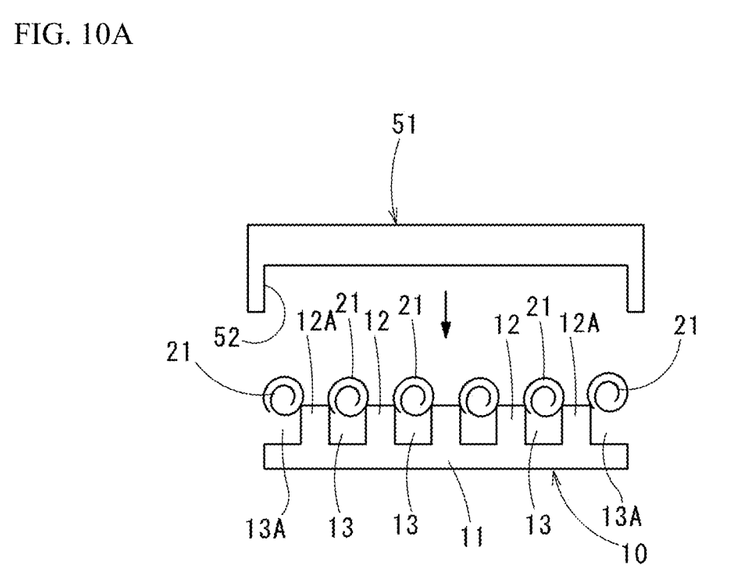
FIG. 10A It is a side view schematically showing a method of manufacturing the heat sink of the embodiment shown in FIG. 1.
Figure 10B:
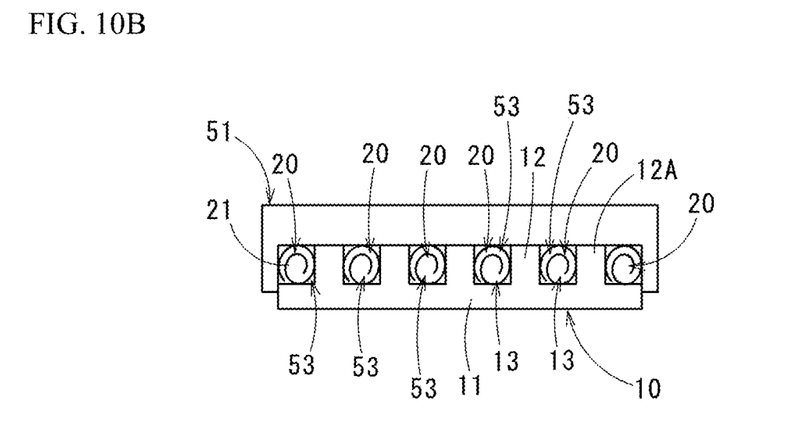
FIG. 10B It is a side view schematically showing the method of manufacturing the heat sink of the embodiment shown in FIG. 1.

The mold 51 is formed of material (e.g., carbon) which does not easily react to the 10 and the 21 of the 20 into a board shape having a rectangular concave portion 52 storing the 12 as shown in FIG. 10A. As shown in FIG. 10B, stacking the mold 51 on the 11 (the 10) to face to each other, and spaces 53 are formed to form the 20 between the 10 (the 11 and the 12) and the mold 51.

The cut pieces generated by cutting of milling machine and the like are prepared for the 21. As shown in FIG. 10A, the 21 are disposed on the groove parts 13 so that the length direction of the 21 follows the length direction of the groove parts 13 between the 12 of the 10.

In the 21a of the 21, some have a larger diameter than the spacing interval c1 of the 12; some have the same as the spacing interval c1; and some has a smaller diameter than the spacing interval c1. Also in the 21b, some are larger; some are the same; and some are smaller, comparing with the spacing interval c1. Therefore, ones in which the d1 of the 21a of the 21 is larger than the spacing interval c1 of the 12 among the 21 are arranged first between the 12 at the upper part of the groove parts 13. Then, ones in which the d1 of the 21a is smaller than the spacing interval c1 are arranged so as to be stacked on the 21 arranged between the 12. By arranging in this manner, the 21 are held at the upper part of the 12 in a state of being in contact with each other as shown in FIG. 10A, and do not fall into the groove parts 13.

The 21 in which the mixed powder of magnesium and silicon as mentioned above is adhered on the surface by the binder are arranged to be aligned on the groove parts 13 between the 12; then the mold 51 is stacked on the 10 and moved ahead so as to press the 21 into the groove parts 13, and the 21 are filled in the spaces 53.

Then, by heating it in inert atmosphere at 600° C. to 660° C. for 0.5 to 60 minutes for example so as to form and sinter the sintered parts 22 on contacting points between the 21 and the 10 (the 12 or the 11) and contacting points between the 21 and 21, it is possible to obtain the heat sink 101 in which the 10 and the 20, the 21 and 21 in the 20 are integrally joined with the sintered parts 22 therebetween.

In the heat sink composed as above described, the 20 are filled inside the groove parts 13 between the 12 of the 10, and the heat is moved in the broad area including the 12, the 11 (the 10), and the 20. Moreover, since the 12 and the 11 are joined to the 20 with the sintered parts 22 therebetween, the thermal resistance is small at the bonding boundary surface of the 12 and 12 with the 20, so that the heat is smoothly moved from the 11 and the 12 to the 20. The heat medium flows through the space in the 20, so that the heat exchange is carried out from the surfaces of the 20, the 12, and the 11 to the heat medium. Since the large surface area is formed by the 20, the heat of the 20 received from the 10 moved to the heat medium efficiently, so that excellent heat transfer coefficient can be obtained. Since the 20 obstruct the flow of the heat medium and the flow of the heat medium can be disturbed, in comparison with a heat sink formed only from solid material, there is an effect of advancing the heat exchange more than enlarging the specific surface area.

Moreover, as described above, since the opening size of the space is large in the 21, the pressure loss is small in the 20 in comparison with foamed metal and fiber porous bodies. The 20 can be freely controlled in the size of the space ratio and the like only by changing thickness and the outer diameter of the 21 and the filling method: flexibility of designing products is high.

Since the 12, the 11, and the 20 are joined at the sintered parts 22 by sintering, not using the brazing material, reduction of the space ratio resulting from permeation of the brazing material (increase of metallic density) does not occur. However, suitable volume of brazing material and soldering material may be used if the space ratio is not excessively reduced: also in this case, the space ratio is preferably not less than 50% and not more than 65%. In the present invention, the bonding parts of the 12 and the 11 to the 20 are called metallurgical bonding parts including the sintered parts and soldered parts.

Since the outer diameter of the coil is different between the one end part (the 21a) and the other end part (the 21b) in each of the 21, the 21 are arranged so that the wires cross to the flow of the heat medium following the length direction of the groove parts 13, so that the heat is reliably received from the heat medium. Moreover, since the cross section of the 21 is formed to be the triangle by the flat surfaces or the curved surfaces with the large curvature radius, the 21 is disposed so that these flat surfaces or the curved surfaces cross the flow of the heat medium. By a multiplier effect of these, the flat surfaces or the curved surfaces of the 21 receive the flow of the heat medium and reliably receive the heat from the heat medium; and the flow meets the surface of the 21 and swirls in a rear of the 21. As a result, the flow of the heat medium is further disturbed and the disturbing effect is increased, and the heat exchange can be further advanced.

Accordingly, it is possible to obtain the heat sink 101 having the high heat transfer coefficient.

The present invention is not limited to the above-described embodiments and various modifications may be made without departing from the scope of the present invention.

Examples

For Examples of the present invention (sample Nos. 1 to 3), the heat sink 101 having the 12 in a belt-board shape (a plate shape) of the above embodiment shown in FIG. 3 was made. In the 11, the vertical dimension: S1=55 mm, the lateral dimension: S2=38 mm, and the board thickness: h0=4 mm. The 12 were formed over the entire length of the 11.

The height h1 of the 12 was 6 mm Table 1 shows the number of the 12, the spacing interval (the width of the groove parts 13) c1 of the 12, the distance c2 from the outer side surface of the outer fin parts 12A arranged outermost in the lateral direction of the 11 to the side edge surface (edge groove parts 13A) of the 11, the DA and the DB of the 21, the whole length (the whole length of the single coil) of the 21, and the winding number N.

The DB of the 21 is the afore-mentioned second outer diameter d2 of the 21b. The DA is the average value of the longest major axis and the perpendicular minor axis in the state in which the 21 are filled between the 12. The cross section of the 21 of Examples is formed to substantially the triangle.

For Comparative Examples (sample Nos. 4 and 5), heat sinks in which fiber porous bodies were used for the fillers were made. Each of the heat sinks of Comparative Examples was also made to have the same dimensions as in the 10 of the sample Nos. 1 to 3.

A1050 was used for the material of the 10 and the 20.

The space ratio was calculated on a basis of the volume of the 20 (a weight of the fillers/a density of the fillers), considering the heat of the heat medium was exchanged on the whole surface (the whole volume V=S1×S2×h1) of the 11 on which the 12 stand.

For measurement of the pressure loss, a measuring device of cooling performance in which the heat medium (water) flows in one direction was used. The heat sink was set in the measuring device; and the heat medium of 30° C. was flown between the 12 at a volume flow 4 L/min (constant) and a difference between the pressures before and behind the heat sink was measured as the pressure loss. The heat medium was flown in the length direction of the 12.

The heat transfer coefficient was led out from the measured values obtained from the tests by the measurement device of cooling performance used for measuring the pressure loss. On a back surface (a surface on which the 12 are not provided) of the 11 in the 101, flexible heat-radiation grease, an object being cooled (a heat generation element), and a heat insulator were stacked in this order; and the object being cooled was press-adhered by a pressing tool with a torque 50 cm·N. In environment conditioned for constant temperature 25° C., the heat medium (water) of 30° C. was flown at 4 L/min for five minutes between the 12 (inside the groove parts 13) so as to confirm that the temperature of the object being cooled (temperature before heated) was stable. Then the heat was generated in the object being cooled by electric power Q of about 450 W for 15 minutes, and measured were temperature Tb1 at a boundary surface between the object being cooled and the 11 at a center of the 11 and water temperature Tw of the heat medium.

Temperature Tb2 at a boundary surface between the heat medium (water) and the 11 was calculated using the temperature Tb1 by a calculation formula of $Tb2=\{Tb1-[Q \times h0/(A \times \kappa)]\}$. Here, h0 is a thickness of the 11, A is a mounted area of the object being cooled on the 11, and $\kappa$ is a thermal conductivity of A1050. The heat transfer coefficient H was calculated from a calculation formula $H=\{Q/[A \times (Tb2-Tw)]\}$ and evaluated as indicators of the heat transfer coefficient of the heat sink. That is to say, the larger the heat transfer coefficient H, the higher is the heat exchange performance of the heat sink.

Table 1 to Table 2 show these results. The heat sinks of the sample Nos. 4 and 5 were Comparative Examples and not provided with the fillers but formed only of the 10, so that items relating the fillers were denoted by "-" in Table 1 and Table 2.

TABLE 1

| | Sample No. | Fin Number | Groove Width c1 [mm] | End Groove Part c2 [mm] | Coil Outer Diameter Maximum DA [mm] | Coil Outer Diameter Minimum DB [mm] | Single Coil Whole Length L [mm] | Winding Number N | Coil Cross Section |
|---|---|---|---|---|---|---|---|---|---|
| Example | 1 | 8 | 3 | 2.1 | 3.3 | 2.4 | 8.2 | 2 | Triangle |
| | 2 | 9 | 2.8 | 1.5 | 3.3 | 2.4 | 8.2 | 2 | Triangle |
| | 3 | 11 | 2.1 | 1.9 | 2.6 | 1.6 | 8.0 | 2 | Triangle |
| Comparative Example | 4 | 9 | 2.8 | 1.5 | — | — | — | — | |
| | 5 | 11 | 2.1 | 1.9 | — | — | — | — | |

TABLE 2

| | Sample No. | N/L [mm$^{-1}$] | (DA-DB)/L | Whole Fins Space Ratio [%] | Pressure Loss [kPa] | Heat Transfer Coefficient [kW/m$^2$K] |
|---|---|---|---|---|---|---|
| Example | 1 | 0.25 | 0.12 | 62 | 1.6 | 40.6 |
| | 2 | 0.25 | 0.12 | 59 | 2.1 | 40.8 |
| | 3 | 0.25 | 0.11 | 55 | 2.0 | 44.9 |
| Comparative Example | 4 | — | — | 55 | 3.4 | 42.6 |
| | 5 | — | — | 54 | 3.9 | 46.5 |

As found from these results, in Sample Nos. 1 to 3 having the 20, the heat transfer coefficient was not less than 40 kW/m$^2$K and the pressure loss was small. In contrast, in Sample Nos. 4 and 5, even though the heat transfer coefficient was high, the pressure loss was large.

INDUSTRIAL APPLICABILITY

It is possible to further improve the heat transfer coefficient of heat sinks and further reduce the pressure loss.

REFERENCE SIGNS LIST

101 Heat sink
10 metal-formed body
11 Base board part
12 Fin part
12A Outer fin part
13 Groove part
13A Edge groove part
20 Filler
21 Coiled metal-wire material
21a Larger-diameter-end portion
21b Smaller-diameter-end portion
22 Sintered part
51 Mold
c1 Spacing interval
c2 Distance
DA Maximum outer diameter
DB Minimum outer diameter
d1 First outer diameter
d2 Second outer diameter
h0 Thickness
h1 Height
t1 Thickness
L Whole length of single coil
N Winding number
V Whole volume

The invention claimed is:
1. A heat sink comprising
a metal-formed body having a base board part and two or more fin parts standing on a surface of the base board part and arranged in a parallel manner to each other, and
one or more filled bodies consisting of a plurality of coiled metal-wire materials filled in one or more groove parts formed between the fin parts of the metal-formed body; wherein
the coiled metal-wire materials have a first outer diameter at one end part and a second outer diameter at the other end part which is different from the first outer diameter; and
the coiled metal-wire materials are metallurgically joined at partially to at least one of an inner surface of the groove parts of the metal-formed body and the other coiled metal-wire materials.

2. The heat sink according to claim 1, wherein the coiled metal-wire materials are made to have a cross sectional shape of a polygon with not more than five corners in a direction perpendicular to a length direction.

3. The heat sink according to claim 1, wherein N/L of the coiled metal-wire materials is not less than 0.1 mm$^{-1}$ where a whole length of single coil is L mm and a winding number is N.

4. The heat sink according to claim 1, wherein (DA−DB)/L is not less than 0.05 where a maximum outer diameter is DA mm, a minimum outer diameter is DB mm, and a whole length of single coil is L mm in the coiled metal-wire materials.

5. The heat sink according to claim 1, wherein the coiled metal-wire materials are cut pieces generated by cutting work.

6. The heat sink according to claim 1, wherein a space ratio of a space volume to a whole volume V=S1×S2×h1 is not less than 50% and not more than 65% where S1×S2 is a flat area of the metal-formed body and "h1" is a height of the fin parts.

7. The heat sink according to claim 2, wherein N/L of the coiled metal-wire materials is not less than 0.1 mm$^{-1}$ where a whole length of single coil is L mm and a winding number is N.

8. The heat sink according to claim 2, wherein (DA−DB)/L is not less than 0.05 where a maximum outer diameter is DA mm, a minimum outer diameter is DB mm, and a whole length of single coil is L mm in the coiled metal-wire materials.

9. The heat sink according to claim 3, wherein (DA−DB)/L is not less than 0.05 where a maximum outer diameter is DA mm, a minimum outer diameter is DB mm, and a whole length of single coil is L mm in the coiled metal-wire materials.

10. The heat sink according to claim 2, wherein the coiled metal-wire materials are cut pieces generated by cutting work.

11. The heat sink according to claim 3, wherein the coiled metal-wire materials are cut pieces generated by cutting work.

12. The heat sink according to claim 4, wherein the coiled metal-wire materials are cut pieces generated by cutting work.

13. The heat sink according to claim 2, wherein a space ratio of a space volume to a whole volume V=S1×S2×h1 is not less than 50% and not more than 65% where S1×S2 is a flat area of the metal-formed body and "h1" is a height of the fin parts.

14. The heat sink according to claim 3, wherein a space ratio of a space volume to a whole volume V=S1×S2×h1 is not less than 50% and not more than 65% where S1×S2 is a flat area of the metal-formed body and "h1" is a height of the fin parts.

15. The heat sink according to claim 4, wherein a space ratio of a space volume to a whole volume V=S1×S2×h1 is not less than 50% and not more than 65% where S1×S2 is a flat area of the metal-formed body and "h1" is a height of the fin parts.

16. The heat sink according to claim 5, wherein a space ratio of a space volume to a whole volume V=S1×S2×h1 is not less than 50% and not more than 65% where S1×S2 is a flat area of the metal-formed body and "h1" is a height of the fin parts.

* * * * *